United States Patent
Shiota et al.

[11] Patent Number: 5,956,837
[45] Date of Patent: Sep. 28, 1999

[54] METHOD OF DETACHING OBJECT TO BE PROCESSED FROM ELECTROSTATIC CHUCK

[75] Inventors: Iku Shiota, Isehara; Kyo Tsuboi, Sagamihara, both of Japan

[73] Assignee: Tokyo Electron Limited, Tokyo, Japan

[21] Appl. No.: 08/970,241

[22] Filed: Nov. 14, 1997

[30] Foreign Application Priority Data

Nov. 20, 1996 [JP] Japan ................................. 8-324558

[51] Int. Cl.$^6$ ............................ B25B 11/00; H02N 13/00
[52] U.S. Cl. ........................... 29/559; 361/234; 279/128; 269/8; 29/825
[58] Field of Search ....................... 269/8, 903; 279/128; 361/234; 29/559, 426.5, 825

[56] References Cited

U.S. PATENT DOCUMENTS

| | | |
|---|---|---|
| 5,065,495 | 11/1991 | Narushima et al. . |
| 5,221,450 | 6/1993 | Hattori et al. . |
| 5,325,261 | 6/1994 | Horwitz . |
| 5,436,790 | 7/1995 | Blake et al. . |
| 5,444,597 | 8/1995 | Blake et al. . |
| 5,459,632 | 10/1995 | Birang et al. . |
| 5,474,614 | 12/1995 | Robbins . |
| 5,491,603 | 2/1996 | Birang et al. . |
| 5,552,955 | 9/1996 | Mashiro et al. . |
| 5,612,850 | 3/1997 | Birang et al. . |
| 5,677,824 | 10/1997 | Harashima et al. . |
| 5,684,669 | 11/1997 | Collins et al. . |
| 5,708,556 | 1/1998 | Van Os et al. . |
| 5,790,365 | 8/1998 | Shel . |
| 5,793,192 | 8/1998 | Kubly et al. . |
| 5,812,361 | 9/1998 | Jones et al. . |

FOREIGN PATENT DOCUMENTS

| | | |
|---|---|---|
| 4216218-A | 11/1992 | Germany . |
| 4-162448 | 6/1992 | Japan . |
| 4-359539 | 12/1992 | Japan . |
| 5-121529 | 5/1993 | Japan . |
| 6-170670 | 6/1994 | Japan . |

*Primary Examiner*—Carl J. Arbes
*Assistant Examiner*—John Preta
*Attorney, Agent, or Firm*—Smith, Gambrell & Russell, LLP; Beveridge, Degrandi, Weilacher & Young Intellectual Property Group

[57] ABSTRACT

After the release of the application of an attraction voltage to an electrostatic chuck that is attracting a semiconductor wafer, the wafer is pushed upward by lifting pins through only a very small projection distance. Immediately after processing has ended, the temperature of the wafer is several tens of degrees higher than that of the electrostatic chuck so that, if the wafer has detached, the temperature of the rear surface thereof will fall toward the original temperature of the electrostatic chuck. If the wafer has not detached, the temperature thereof will not fall. Therefore, a determination is made as to whether the wafer has detached or whether it is being subjected to residual attraction, based on temperature change data obtained for the wafer in combination with the electrostatic chuck, by a temperature sensor after the wafer has been pushed upward by a very small projection distance. If there is residual attraction, wafer transfer is halted. This makes it possible to prevent damage to the wafer that would occur if an unreasonable force is applied to the wafer by the residual attraction when the wafer is being detached from the electrostatic chuck.

9 Claims, 9 Drawing Sheets

METHOD OF DETACHING OBJECT TO BE PROCESSED FROM ELECTROSTATIC CHUCK

BACKGROUND OF THE INVENTION

1. Field of the Invention

The present invention relates to a method of detaching an object to be processed from an electrostatic chuck for attracting and holding an object to be processed such as a semiconductor wafer.

2. Description of Related Art

When a process such as film formation or etching is performed with respect to a semiconductor wafer, the wafer must be held in a state in which it is pressed against a mounting stand, for various reasons such as to ensure heat transfer from the mounting stand to the wafer. However, if the wafer is being processed in a vacuum, it is not possible to use a vacuum chuck. Various mounting stand configurations are used instead, such as a mechanical pressing means using a ring or the like, or an electrostatic chuck by which the wafer is attracted to and held against the top of the mounting stand by electrostatic force. Electrostatic chucks are widely used because of their simple structure.

As shown in FIG. 9, the structure of an electrostatic chuck type of mounting stand is such that an electrostatic chuck 12 is provided on an upper surface of a main mounting stand unit 11 that is made of a material such as aluminum. The electrostatic chuck 12 is provided with a pair of electrodes 14, made of a material such as tungsten foil embedded in a dielectric member 13, and the electrodes 14 are connected to a DC power source 17 by leads 15 and a switch 16. A material such as a polyimide sheet has long been employed as the dielectric member 13 used in such an electrostatic chuck 12, but this type of electrostatic chuck is likely to become greatly damaged by plasma if it is used in electron cyclotron resonance (ECR) plasma processing, so the present inventors are investigating the use of ceramics such as Alumina ($A\ell_2O_3$) or aluminum nitride ($A\ell N$).

In an ECR plasma processing apparatus, for example, a wafer that has been conveyed into a vacuum chamber is mounted on the electrostatic chuck 12, the switch 16 is turned on to form electric lines of force by applying a DC current to the electrodes 14. This generates an electrostatic attraction force between the wafer W and the electrostatic chuck 12, which attracts and holds the wafer W onto the electrostatic chuck 12. When the wafer W is to be detached after the plasma processing, the switch 16 is turned off to release the application of the DC voltage, but the residual charge is so large, means such as beaming a plasma onto the wafer is used to remove the charge, then lifting pins 18 are pushed upward from the upper surface of the electrostatic chuck 12 so that the wafer can be conveyed away by a conveyor arm (not shown).

It has become clear that if a ceramic such as $A\ell_2O_3$ or $A\ell N$ is used as the dielectric member 13, a fairly large residual force of attraction acts on the wafer as thermal oxidation progresses. It is inferred that this is due to the formation of a thermal oxide film on the rear surface of the wafer as well, while the wafer is being subjected to thermal oxidation in the heating furnace. Not only is this thermal oxide film highly insulating, but the ceramic also has a fairly large dielectric constant (so it is highly insulating).

If the thus produced residual attraction is too large, there is a danger that a force that exceeds the elastic breakage limit of the wafer W will be applied thereto when the lifting pins 18 are pushed upward, and the wafer W could be broken thereby. If the wafer W breaks, fragments will fly around the vacuum chamber and will have to be disposed of. In such a case, the vacuum chamber will have to be disassembled and cleaned, after which the predetermined vacuum environment must be re-established. Not only is the work of disassembling and reassembling the vacuum chamber time-consuming, but the job of gathering up all the tiny scattered fragments is also extremely troublesome. In addition, a long period of time is required for evacuating the chamber, which results in a large amount of work, not only during the actual processing but also during maintenance, which causes problems concerning the large loss of time.

The present invention was devised in the light of the above situation and has as its object the provision of a method of determining the strength of residual attraction with respect to an object to be processed, such as a wafer, before a step of detaching the object to be processed from an electrostatic chuck and conveying it outward, thus preventing damage to the object to be processed.

SUMMARY OF THE INVENTION

The above object is attained according to the present invention by a method of detaching an object to be processed from an electrostatic chuck, which comprises: a release step of releasing an application of an attraction voltage to an electrostatic chuck for electrostatically attracting an object to be processed; a subsequent detachment step of applying to the object to be processed a force in a direction away from the electrostatic chuck, of a level that does not damage the object, even if the object to be processed is being subjected to residual attraction toward the electrostatic chuck; a determination step of determining whether the object to be processed is being subjected to residual attraction toward the electrostatic chuck or whether the object has been detached from the electrostatic chuck, as a result of the detachment step; and a conveyor step of conveying the object away from the electrostatic chuck by a transfer means, after it has been determined by the determination step that the object has been detached.

In the method in accordance with the present invention, the detachment step may comprise a step of causing a lifting member to protrude by a very small distance from a surface of the electrostatic chuck to which the object to be processed is attracted, to push the object to be processed upward relative to the surface of the electrostatic chuck to which the object to be processed is attracted.

The determination step may be performed by a comparison of a temperature detected from the object to be processed and a determination reference temperature, which is derived on the basis of temperature change data for the object to be processed that is obtained when the object to be processed is being subjected to residual attraction toward the electrostatic chuck and temperature change data for the object to be processed that is obtained when the object to be processed has been detached from the electrostatic chuck.

Furthermore, this determination step may be a step of determining whether or not the temperature of the object to be processed has fallen by at least a predetermined value, after a predetermined period of time has elapsed after the detachment step.

DESCRIPTION OF THE PREFERRED EMBODIMENTS

Figure 1:
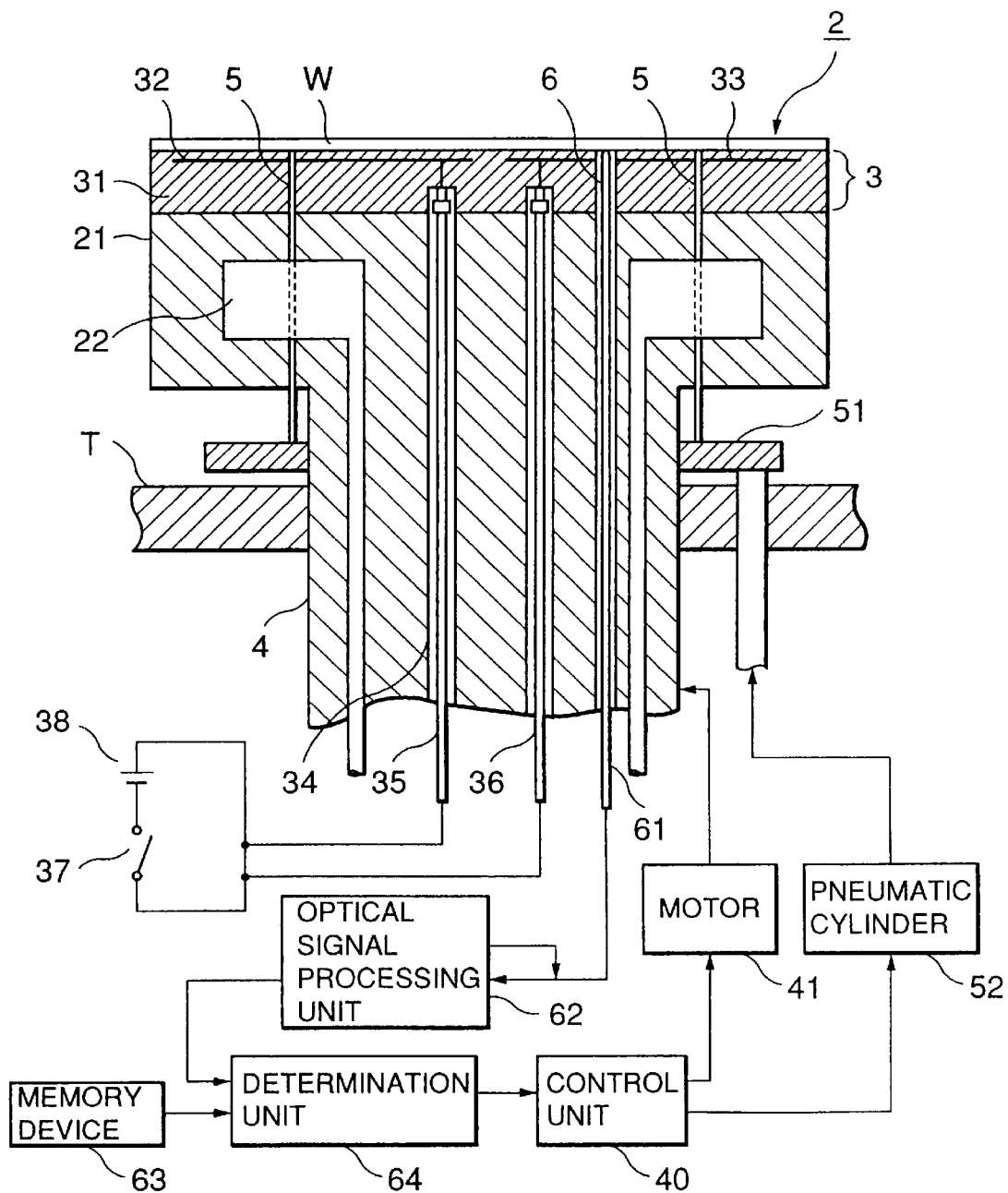
FIG. 1 is a sectional view through a mounting stand used for carrying out the detachment method for electrostatic chuck according to the present invention.

FIG. 1 shows a sectional view through a wafer mounting stand used for implementing the detachment method for an electrostatic chuck in accordance with this invention. A mounting stand 2 comprises an electrostatic chuck 3 on top of a main mounting stand unit 21 which is made of a material such as aluminum, and it is provided on an upper portion of a circular cylindrical support member 4 passing through a bottom wall T of a vacuum chamber. This support member 4 is configured in such a manner that it can be raised and lowered by a motor 41 while the vacuum chamber is maintained sealed, as will be described later.

The electrostatic chuck 3 has a pair of electrodes 32 and 33, which are formed of a material such as tungsten foil, embedded within a circular dielectric member 31 of a thickness of 15 mm, for example. A material such as aluminum nitride ($A\ell N$) or alumina ($A\ell_2O_3$) may be used for the dielectric member 31. These electrodes 32 and 33 may be of various different forms, such as a flat type with semicircular parts thereof disposed over regions on left and right halves of the dielectric member 31. Alternatively, they could be formed as flat circular rings coaxial with respect to the center of the dielectric member 31. The electrodes 32 and 33 are connected electrically to one end of each of power lines 35 and 36, respectively, which pass through holes 34 penetrating the mounting stand 2 and the support member 4 in the vertical direction. Between the other ends of these power lines 35 and 36 is connected a DC power source 38 and a switch 37 disposed below the vacuum chamber.

Figure 2:
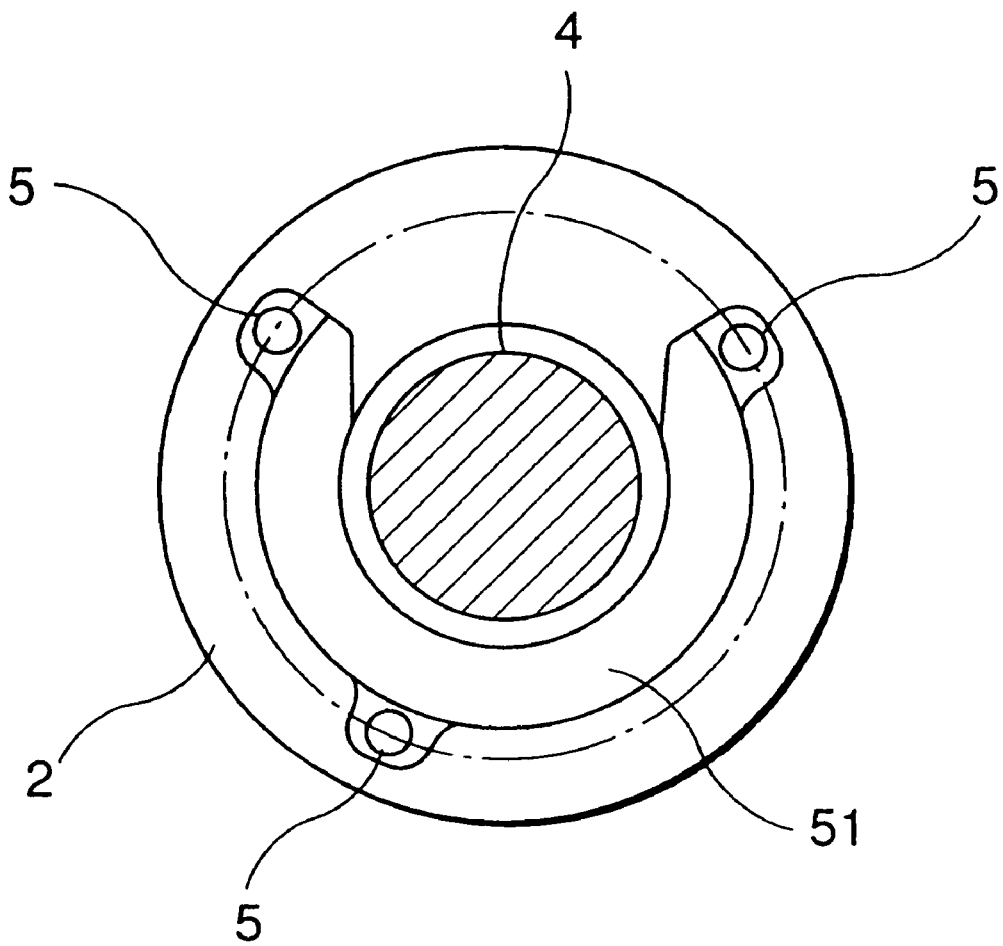
FIG. 2 is a plan view of lifting pins.

The mounting stand 2 is also provided with a number of lifting pins 5, such as three lifting pins 5, that are freely movable in the vertical direction. These lifting pins 5 may be embedded at planar positions that form the vertices of an isosceles triangle, for example, on a lifting stand 51 that is formed in a horseshoe-shape around the support member 4, as shown in FIG. 2. The lifting stand 51 is configured to be raised and lowered independently of the mounting stand 2, by means of a pneumatic cylinder 52. The motor 41 for raising and lowering the support member 4 and the pneumatic cylinder 52 for raising and lowering the lifting pins 5 are controlled in accordance with control signals from a control unit 40. A coolant passageway 22 is formed within the main mounting stand unit 21, coolant from an external coolant supply source is supplied and circulated therethrough, and a temperature adjustment means is configured by that and a heater (not shown in the figure) within the mounting stand 2.

A temperature detection portion 6 is provided in the mounting stand 2 for detecting the temperature of a wafer W that is an object to be processed, to enable control of the temperature of the mounting stand 2. This temperature detection portion 6 is configured by a tip end portion of an optical fiber 61 passed within a through hole formed in the mounting stand 2 and the support member 4, and the positions of the tip end portions thereof are at substantially the same level as the mounting surface of the mounting stand 2. Each tip end portion is applied with a fluorescent material whose attenuation curve of luminous strength varies in accordance with the temperature at that tip end portion. The base end of each optical fiber 61 is connected to an optical signal processing unit 62. The principle of the temperature detection is such that light from the optical signal processing unit 62 strikes the fluorescent material through the optical fiber 61, and the temperature of the wafer W is detected on the basis of a factor such as the half-life of the luminous strength thereof.

The detachment method for the electrostatic chuck shown is such that this temperature detection is used to determine whether or not the wafer W has been detached from the electrostatic chuck 3. In other words, temperature change data obtained when a wafer W has been detached from the electrostatic chuck 3 and temperature change data obtained when a wafer has not been detached therefrom are derived, and these data are stored within a memory device 63, for example, as determination reference data. A determination unit 64 determines whether detachment has occurred on the basis of the determination reference data and temperature data from the optical signal processing unit 62 that is part of the temperature detection unit 6.

Figure 3:
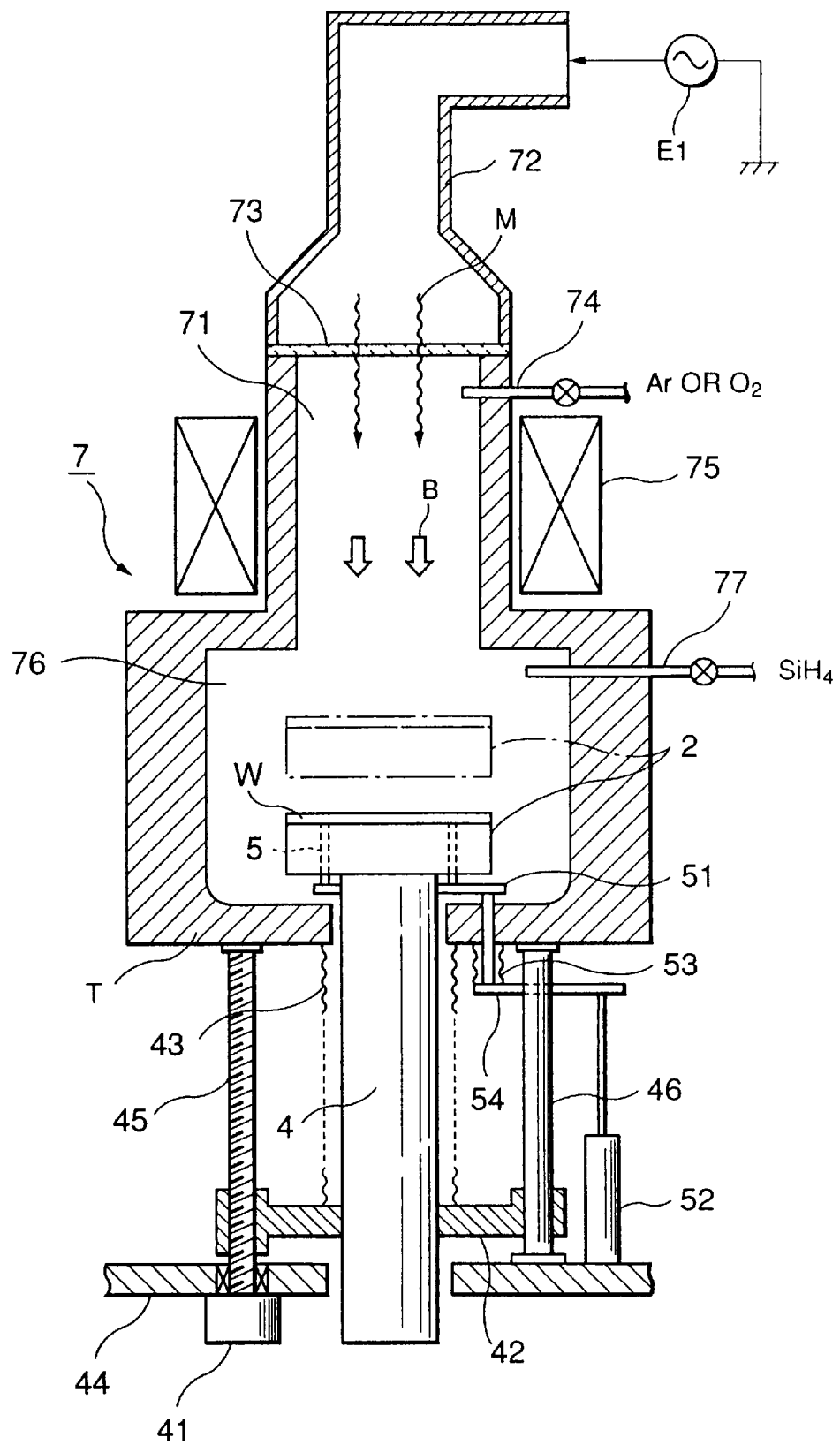
FIG. 3 is a cross-sectional view through an ECR plasma apparatus as an example to which the method of the invention is applied.

The description now turns to a brief discussion of the overall configuration of a vacuum processing apparatus that uses this mounting stand 2, such as an ECR plasma apparatus, with reference to FIG. 3. This ECR plasma apparatus is configured in such a manner that microwaves M at, for example, 2.45 GHz from a high-frequency power source E1 are guided into a plasma chamber 71 at an upper part of a vacuum chamber 7 from a waveguide 72 and through a transmission window 73. In addition, a plasma gas such as Ar or $O_2$ is supplied into the plasma chamber 71 from a plasma gas nozzle 74, and a magnetic field B is applied thereto by an electromagnetic coil 75 that is provided outside the plasma chamber 71 to generate electron cyclotron resonance. A reaction gas nozzle 77 protrudes into a reaction chamber 76 in a lower part of the vacuum chamber 7, and the mounting stand 2 is provided through the bottom wall of the vacuum chamber 7.

A flange portion 42 is provided on a lower portion of the support member 4 of the mounting stand 2. A bellows member 43 is provided between this flange portion 42 and the bottom wall T of the vacuum chamber 7 so as to surround the support member 4 and thus maintain a hermetic seal. A fixed base 44 is provided below the vacuum chamber 7, and a threaded shaft 45 driven in rotation by the motor 41 is provided between the fixed base 44 and the bottom wall T. The threaded shaft 45 is threaded through the flange portion 42 and the support member 4 is raised and lowered by the rotation of this threaded shaft 45. Reference numeral 46 denotes a guide rod for guiding the flange portion 42.

The lifting stand 51 is fixed on top of an elevator body 54 that penetrates into the vacuum chamber 7 from below and is maintained in a hermetically sealed state by a bellows member 53. This elevator body 54 is driven by the pneumatic cylinder 52.

The description now turns to an embodiment of this method, taking the above described ECR plasma apparatus as an example. First of all, a wafer W that is an object to be processed is transferred from a known load-lock chamber (not shown in the figures) onto the mounting stand 2, which is at a reception position shown by solid lines in FIG. 3, by a known conveyor arm that is a transfer means (not shown). This transfer is done by pushing the lifting pins 5 upward from the top of the mounting stand 2 and transferring the wafer W from the conveyor arm to the lifting pins 5. The switch 37 is turned on to apply an attraction voltage that is a DC voltage of, for example, 1500 V between the electrodes 32 and 33 of the electrostatic chuck 3. This causes the wafer W to be attracted electrostatically to the electrostatic chuck 3.

The mounting stand 2 is subsequently raised by, for example, 150 mm to a processing position that is shown by imaginary lines in FIG. 3. The wafer W is then heated to a predetermined temperature, such as 150° C., by a combination of the coolant in the coolant passageway 22 and a heater (not shown), and also a gas such as Ar or $O_2$ is introduced into the vacuum chamber 7 through the nozzle 74 and a gas such as $SiH_4$ is introduced thereinto through the nozzle 77. The $SiH_4$ is activated by plasma ions flowing into the reaction chamber 76, to form an $SiO_2$ film on the wafer W.

Figure 4A:
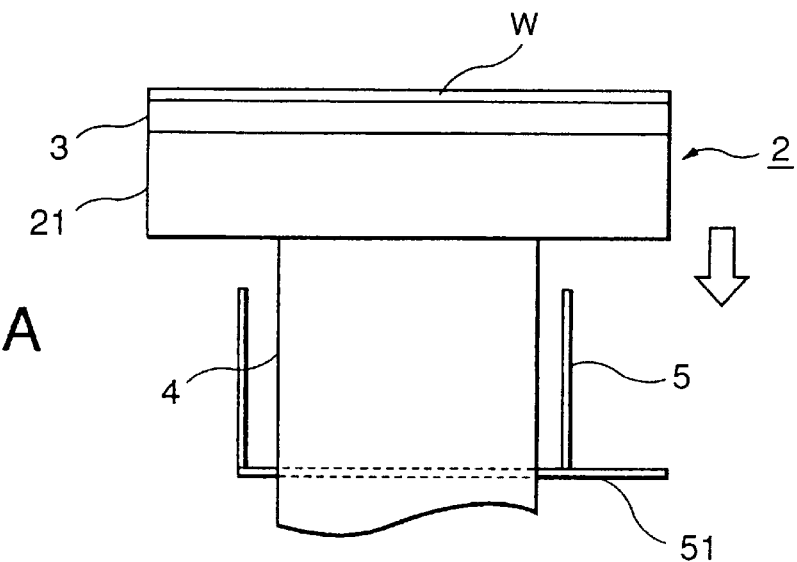
FIGS. 4A to 4C are illustrative views showing sequential operational steps until the wafer on the mounting stand is transferred to a conveyor arm.

After this plasma processing, the switch 37 is turned off to release the application of the attraction voltage. The lifting pins 5 are then moved to an uppermost limit position and the motor 41 is controlled to lower the mounting stand 2 from the processing position shown by the imaginary lines in FIG. 3 to a position at which the lifting pins 5 protrude by a very small projection distance, such as only 0.25 mm. This sequence will now be described with reference to FIGS. 4A and 4B. If the lifting pins 5 are shifted relatively upwards by a very small projection distance, in other words, if the wafer W is raised relative to the surface, and the electrostatic attraction force (residual attraction force) due to the residual charge is weak, the entire surface of the wafer W will be detached from the mounting surface of the electrostatic chuck 3. However, if the residual attraction force is large at that time, the wafer W will remain attracted to the mounting surface of the electrostatic chuck 3, as shown in FIG. 4B, so that only the portions thereof that are pushed upwards by the lifting pins 5 will be forcibly peeled away from the mounting surface, bending the wafer W.

Figure 4B:
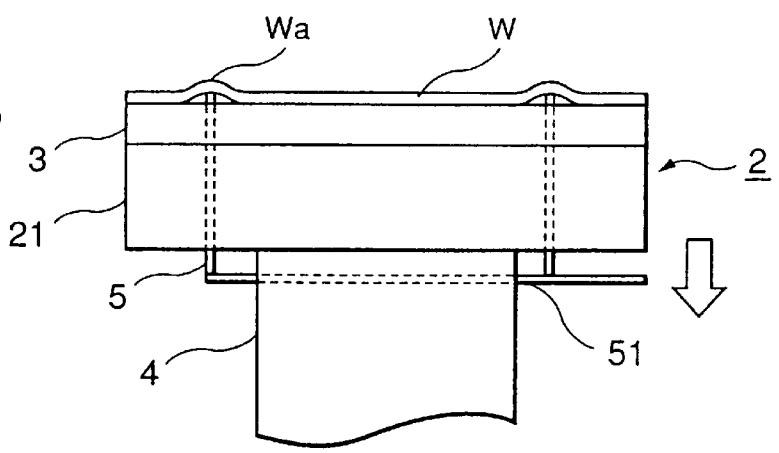
Figure 5:
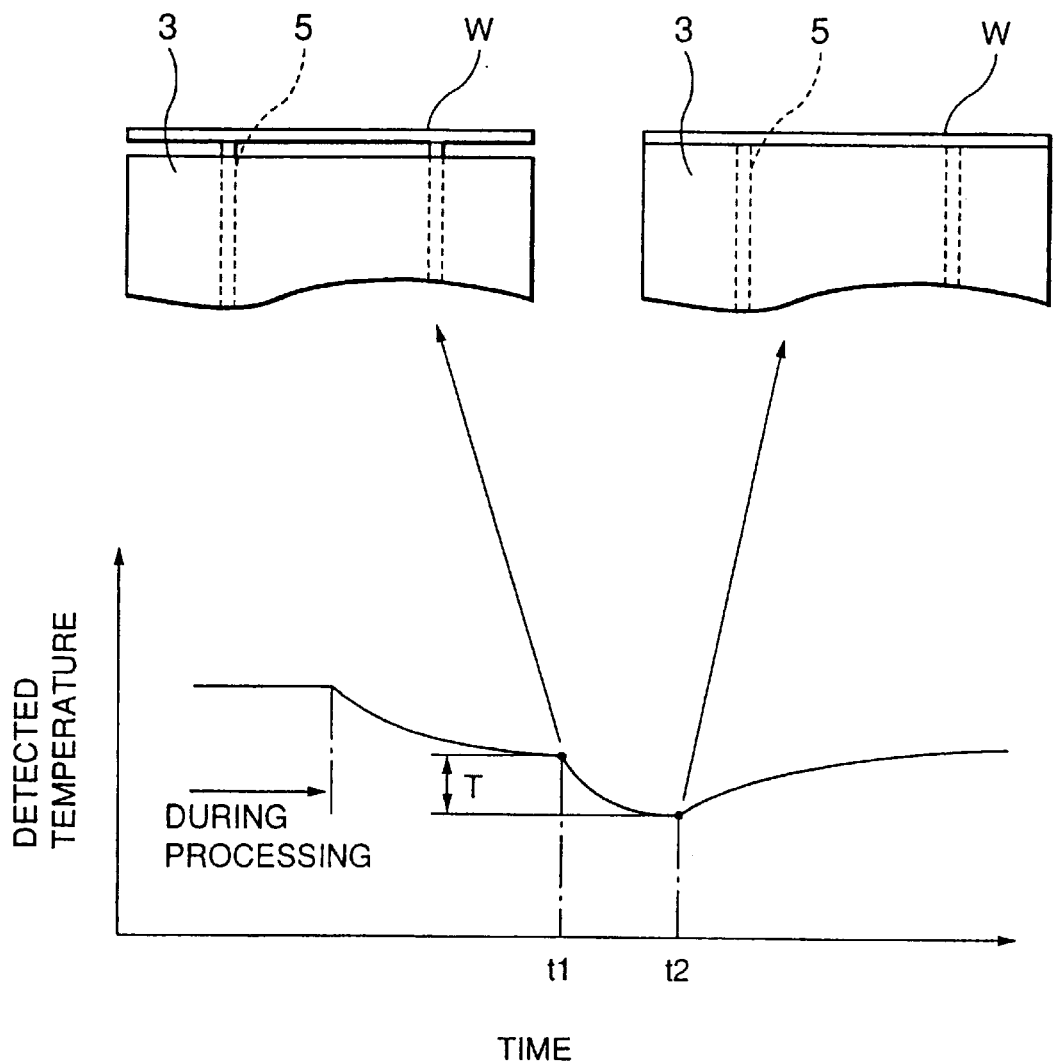
FIG. 5 is a graph of temperature change data obtained when the wafer has detached after being pushed upward by a very small distance.

With this embodiment of the invention, between an event in which the wafer W has been fully detached and an event in which residual attraction remains and the entire surface of the wafer W has not been detached, as shown in FIG. 4B, differences in temperature will occur over the surface of the electrostatic chuck 3. There will therefore be differences in the temperature change data obtained by the temperature detection portion 6. Temperature change data obtained by the temperature detection portion 6 during and after the processing is shown in FIG. 5. This graph includes temperature change data obtained at a time t1 at which the wafer W was detached by pushing the lifting pins 5 upward by a very small distance, and that obtained at a time t2 at which the wafer W was placed back onto the electrostatic chuck 3.

The processing of this example has put the wafer W in a state in which it has a higher temperature than the electrostatic chuck 3, and the temperature of the wafer W remains higher than that of the electrostatic chuck 3 for some time after the processing ends. This means that, if the wafer W detaches at the time t1, the temperature of the wafer falls to the original temperature of the electrostatic chuck 3. The detection end of the temperature detection portion 6 is at the same temperature as that of the wafer W, because the wafer W is detached therefrom, so the detected temperature value falls. This temperature-fall pattern can be perceived after the wafer W has been detached for about ten seconds, during which time the detected temperature value falls by T (about 30° C.).

Figure 6:
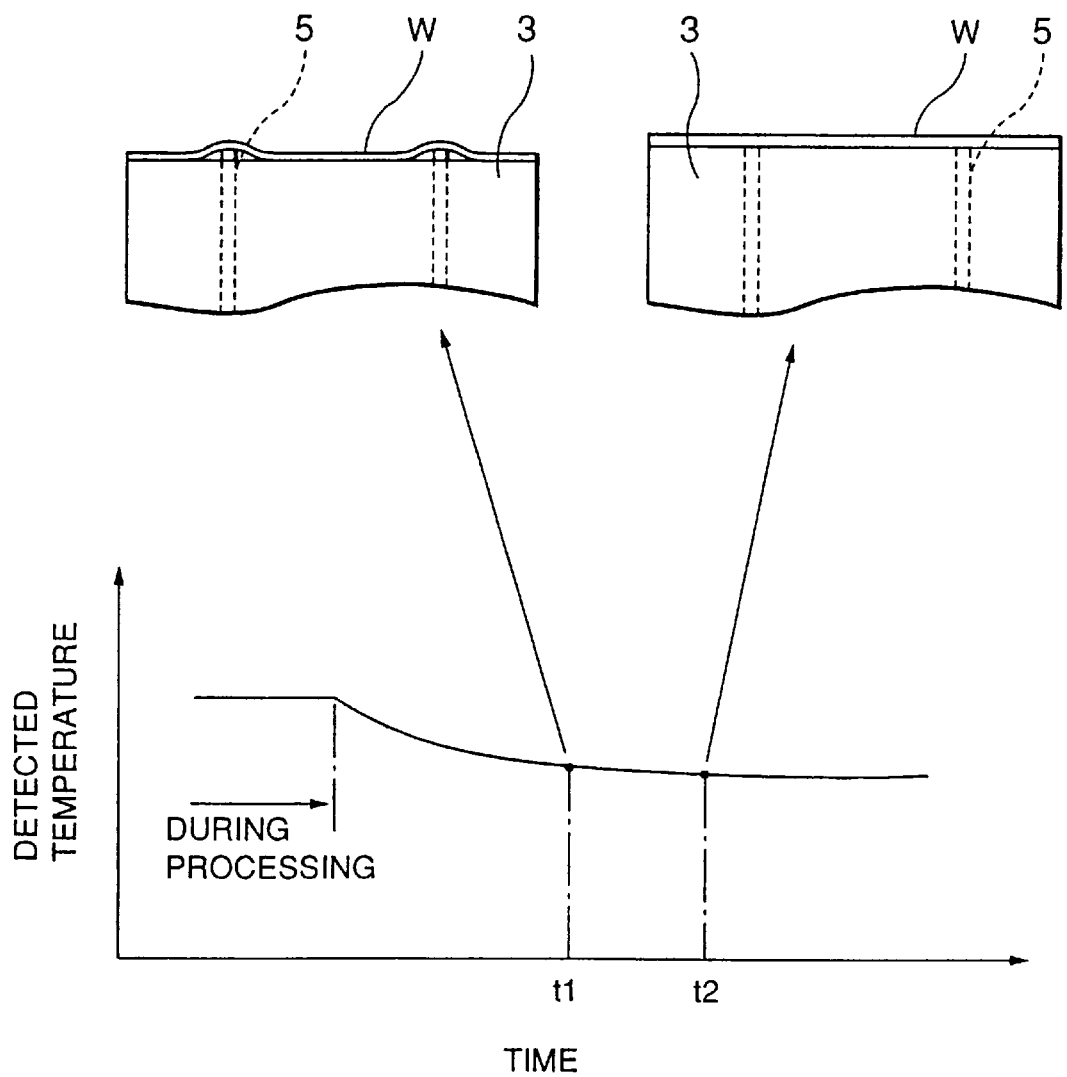
FIG. 6 is a graph of temperature change data obtained when the wafer has not detached after being pushed upward by a very small distance.

Conversely, FIG. 6 shows temperature change data obtained if the wafer W does not become detached from the electrostatic chuck 3 when the lifting pins 5 are pushed upward at the time t1. Since the temperature detection portion 6 continues to detect the temperature of the wafer W during this time, there is no fall T in the detected temperature value, as there is when the wafer W does become detached. It is therefore possible to set a determination reference value for identifying which of the above events has occurred, based on the difference between these two sets of temperature change data. This reference value is stored in the memory device 63 (FIG. 1), the detected temperature value and the reference value are compared at a certain period of time after the lifting pins 5 have been pushed upward, such as after ten seconds, and thus it can be determined that the wafer W has been detached if the detected temperature value falls below the reference value, or that it has not been detached if the detected temperature value does not fall below the reference value. If the temperature of the wafer W during the processing is 260° C., for example, this determination reference value could be set to 255° C.

The very small projection distance when the lifting pins 5 are pushed upward is not enough to cause the wafer W to break when it is pushed up locally, in other words, it does not exceed the elastic breakage limit. For an 8-inch wafer, for example, this can be no more than 1 mm.

Figure 4C:
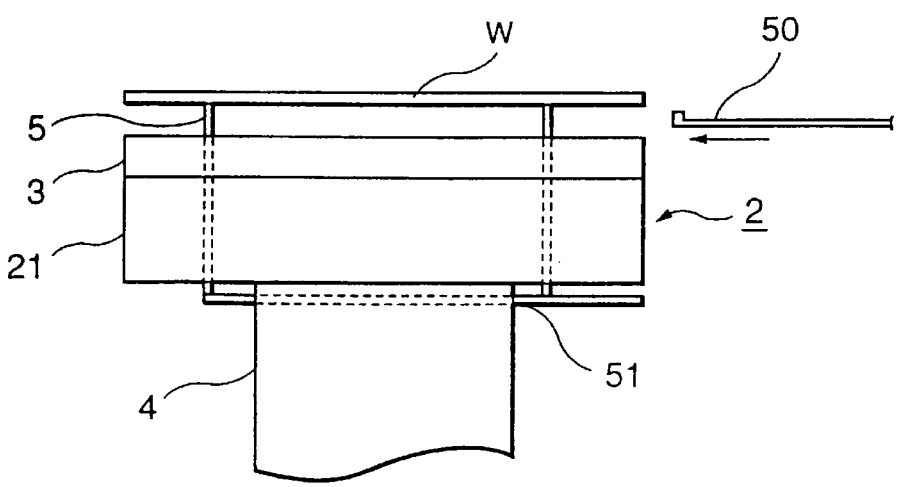
Figure 7:
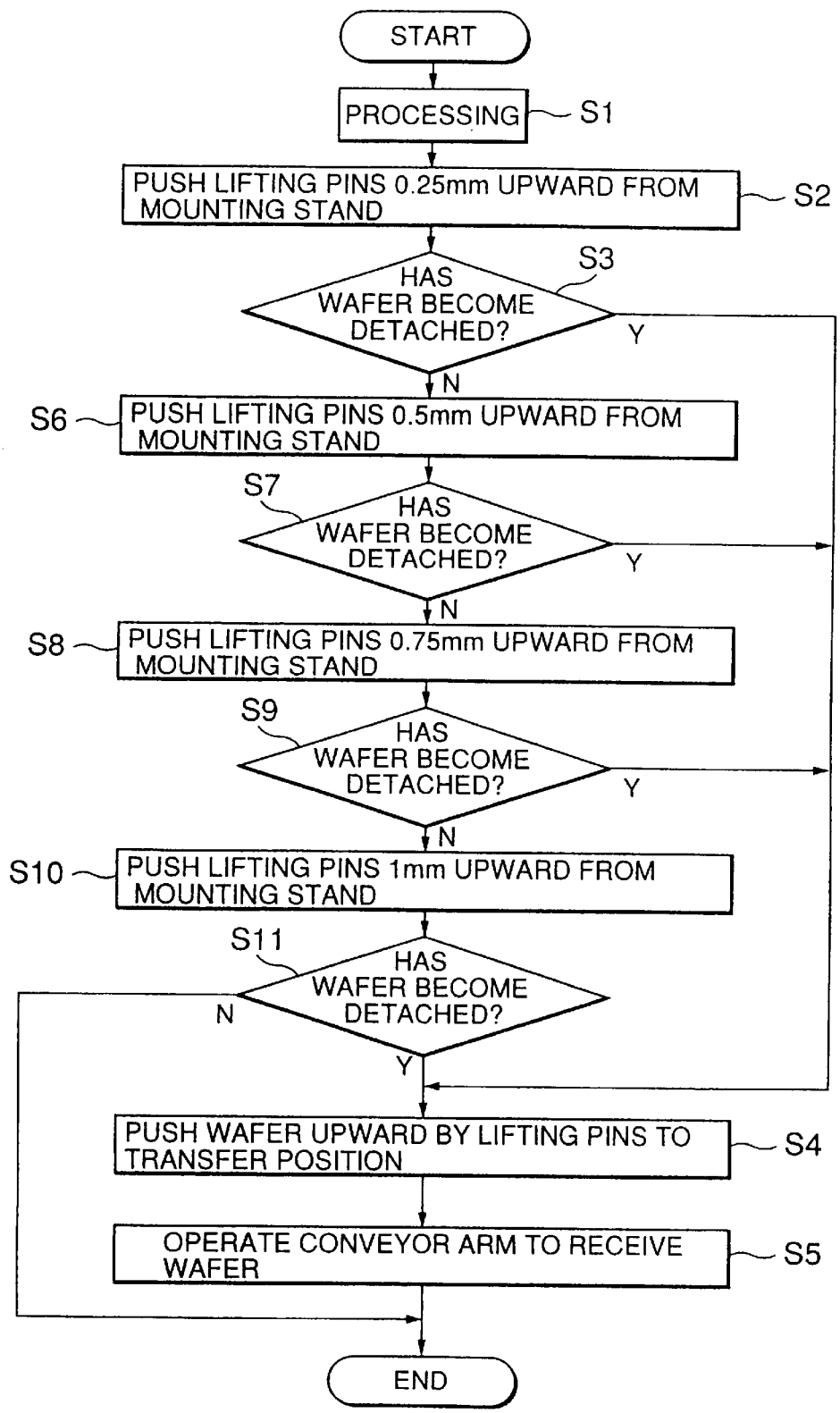
FIG. 7 is a flowchart of the method according to the invention.

An example of a specific method of determining whether or not the wafer W has been detached will now be described with reference to FIG. 7. After the processing has ended (step S1), the lifting pins 5 are pushed up from the mounting stand 2 (from the surface of the electrostatic chuck 3) by only 0.25 mm (step S2), and it is determined whether or not the wafer W has been detached. If the wafer W has been detached, the mounting stand 2 is lowered and the lifting pins 5 are pushed up by 12 mm, for example, as shown in FIG. 4C, so that the wafer W is pushed up to the transfer position (step S4). A conveyor arm 50 that is a transfer means is then inserted between the lifting pins 5 to scoop up the wafer W from below and transfer it into a load-lock chamber (not shown).

If, on the other hand, it is determined that the wafer W has not become detached, the mounting stand 2 is lowered further so that the lifting pins 5 protrude relative therefrom by 0.5 mm (step S6), and a determination is again made as to whether or not the wafer W has detached (step S7). If the wafer W still does not detach, the mounting stand 2 is lowered further in 0.25-mm stages until the lifting pins 5 protrude therefrom by 1.0 mm (steps S8 to S11). If the wafer W still does not detach, it is determined that detachment is impossible. The apparatus then waits until the residual charge has weakened and it becomes possible to detach the wafer W.

With the above described embodiment, the lifting pins 5 are not pushed up all at once through a distance corresponding to the position for transferring the wafer W after the application of the attraction voltage has been released. Instead, the lifting pins 5 are made to protrude by a very small projection distance to apply to the wafer W a force of a level that is not enough to break the wafer W if there is any residual charge thereon, so that it is possible to learn the strength of the residual attraction beforehand and thus prevent damage to the wafer W. It is therefore possible to avoid the troublesome work that would be entailed if the wafer W were to break and scatter fragments within the vacuum chamber 7, which enables an improvement in total throughput.

When the lifting pins 5 are pushed upward by a very small projection amount, they are pushed further upward in steps of 0.25 mm, for example, and they are left for ten seconds or so after being pushed up. This allows the residual attraction to gradually weaken, even if the residual attraction is strong, so that the wafer can be detached smoothly. Note that the stepwise raising of the lifting pins 5 is not limited to steps of 0.25 mm; any other stepwise increment could be used instead, such as steps of about 1 mm. The incremental lifting varies depending on the size of the wafer. The above mentioned lifting amounts are suitable for 8-inch wafers. However, a maximum lifting amount of 3 mm could be used for 12-inch wafers instead of 1 mm for 8-inch wafers.

Furthermore, the invention could be implemented in various other ways, such as a method in which the lifting pins 5 are raised by the very small projection distance, and, if it is determined that the wafer W has not detached, the mounting stand 2 is raised and the lifting pins 5 are temporarily retracted into the mounting stand 2. The lifting pins 5 are once again pushed upward by the very small projection distance and halted at that position, and these operations could be repeated a predetermined number of times to ensure that wafer W is pushed upward repeatedly by the lifting pins 5 to weaken the residual attraction acting on the wafer W. In such a case, each of the steps S3, S7, S9, and S11 of the flowchart of FIG. 7 is repeated a plurality of times.

Figure 8A:
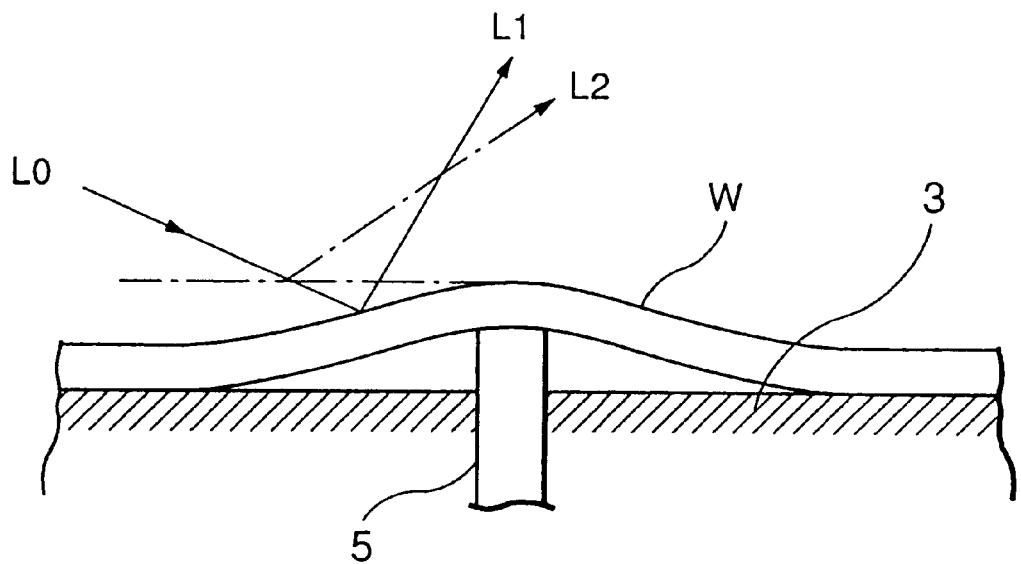
FIGS. 8A and 8B are illustrative views of another example of the step of determining whether or not the wafer has been detached, based on wafer mounting condition.
Figure 8B:
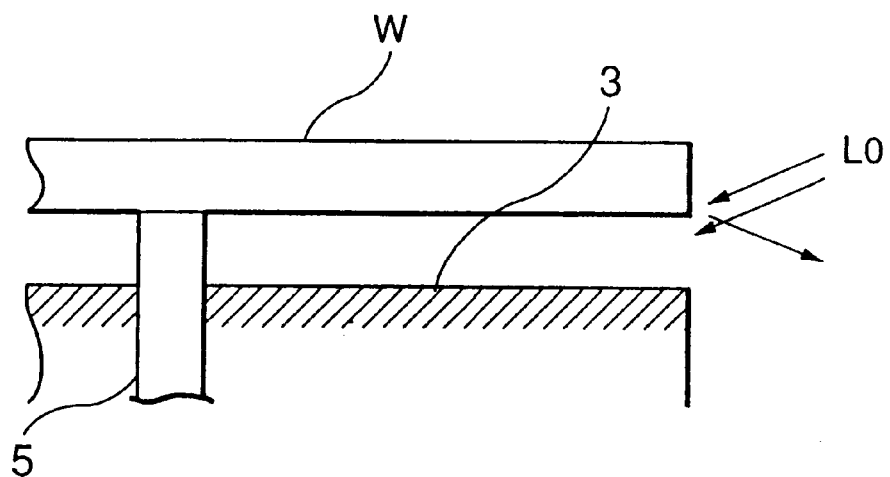
Figure 9:
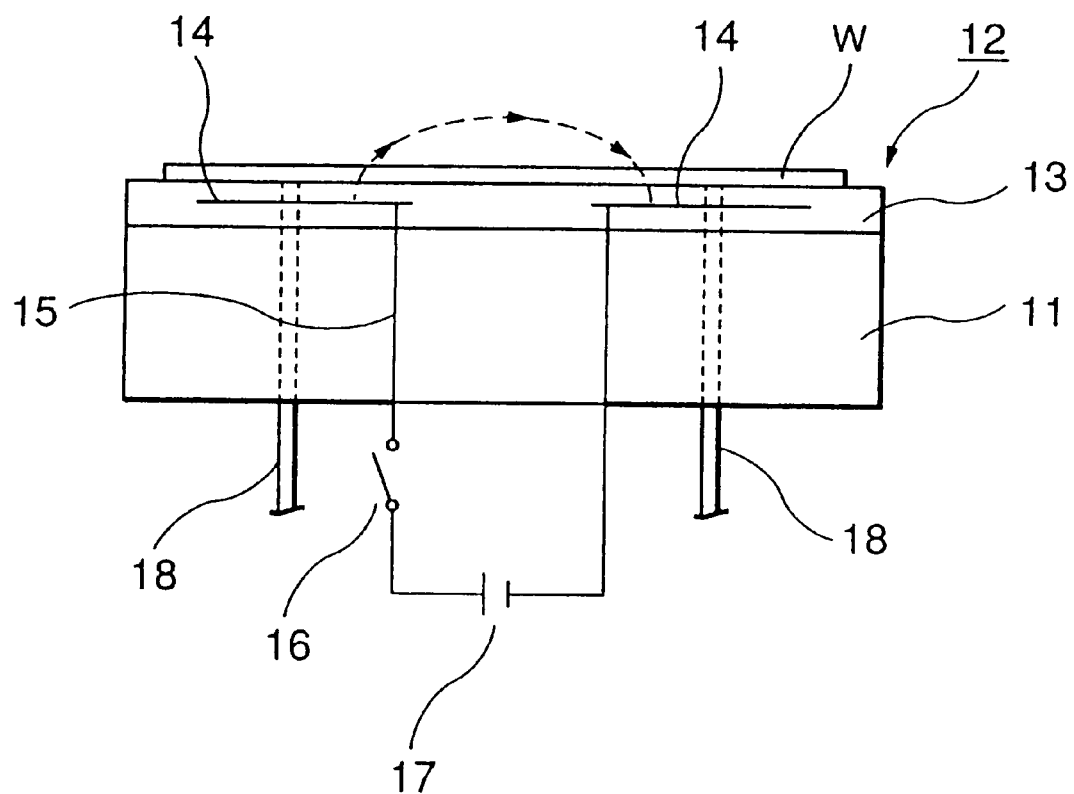
FIG. 9 is a sectional view through a prior-art electrostatic chuck.

Methods illustrated in FIGS. 8A and 8B could be used to determine whether or not the wafer W is still being subjected to residual attraction toward the electrostatic chuck 3 when the wafer W has been pushed upward through the very small projection distance by the lifting pins 5. When the lifting pins 5 are pushed upward, the state of the surface of the wafer W in the vicinity of each of the lifting pins 5 depends on whether or not detachment has occurred. Thus, light L0 that is incident at an angle on the wafer W is reflected as shown by L1 in FIG. 8A if detachment has not occurred, but is reflected as shown by L2 if detachment has occurred. This makes it possible to determine whether or not detachment has occurred, by setting a light-receiving portion at a suitable position, such as at a position at which light is received thereby only when light is reflected as shown by L2.

Alternatively, if light is shone toward the peripheral edge portion of the wafer W, as shown in FIG. 8B, the amount of light reflected therefrom will depend on whether or not the wafer W has detached, making it possible to determine that the wafer W has detached by detecting the amount of thus received light. If the wafer W has not detached, light incident on the peripheral edge portion of the wafer is reflected, whereas if the wafer W has detached, incident light advances into the gap formed between the electrostatic chuck 3 and the wafer so that the reflected light is reduced drastically. This enables the detection of whether the wafer has detached or not.

This invention can also be applied to a method that transfers the wafer by means such as a clamping means that clamps the peripheral edge portion of the wafer, for example, without using lifting pins. In such a case, the determination as to whether or not the wafer has separated can be done by applying to the wafer held on the mounting stand by the clamping means a force in a direction away from the electrostatic chuck, of a level that is not enough to break the wafer. The mounting stand 2 could also be orientated vertically. The apparatus to which this invention is applied is similarly not limited to an ECR plasma apparatus; it can also be applied to a plasma CVD apparatus, a plasma etching apparatus, or a dry etching apparatus.

As described above, the present invention makes it possible to prevent damage to the object to be processed such as a wafer before it occurs, by determining the strength of any residual attraction holding the object, before a step of causing the object to detach from an electrostatic chuck for transfer.

What is claimed is:

1. A method of detaching an object to be processed from an electrostatic chuck, comprising the steps of:

releasing an application of an attraction voltage to an electrostatic chuck for electrostatically attracting an object to be processed;

subsequently applying to said object a mechanical force in a direction away from said electrostatic chuck, of a level that does not damage said object to be processed, even if said object is being subjected to residual attraction toward said electrostatic chuck;

detecting a temperature of said object;

comparing the detected temperature of the object with a reference temperature, which is derived on the basis of temperature change data for said object that is obtained when said object is being subjected to residual attraction toward said electrostatic chuck and temperature change data for said object that is obtained when said object has been detached from said electrostatic chuck;

determining whether or not said object is being subjected to residual attraction toward said electrostatic chuck, as a result of said step of comparing the temperature of the object with the reference temperature; and conveying said object away from said electrostatic chuck by a transfer means, when it has been determined by said determining step that said object is not being subjected to residual attraction and hence has been detached from said electrostatic chuck.

2. The method of detaching an object to be processed from an electrostatic chuck as defined in claim 1, wherein said step of applying a mechanical force comprises a step of causing a lifting member to protrude by a very small distance from a surface of said electrostatic chuck to which said object is attracted, to push said object away relative to said surface of said electrostatic chuck to which said object is attracted.

3. The method of detaching an object to be processed from an electrostatic chuck as defined in claim 2, wherein said very small distance is no more than 3 mm.

4. The method of detaching an object to be processed from an electrostatic chuck as defined in claim 2, wherein said very small distance is no more than 1 mm.

5. The method of detaching an object to be processed from an electrostatic chuck as defined in claim 2, wherein said very small distance is no more than approximately 0.25 mm.

6. The method of detaching an object to be processed from an electrostatic chuck as defined in claim 1, wherein, if said determining step has determined that said object is being subjected to residual attraction toward said electrostatic chuck, said detachment step is performed again.

7. The method of detaching an object to be processed from an electrostatic chuck as defined in claim 1, wherein said step of applying a mechanical force comprises a step of pushing said object by a very small distance away from a surface of said electrostatic chuck to which said object is attracted.

8. The method of detaching an object to be processed from an electrostatic chuck as defined in claim 1, wherein said determining step comprises a step of determining whether or not the temperature of said object to be processed has fallen by at least a predetermined value, after a predetermined period of time has elapsed after said step of applying a mechanical force.

9. The method of detaching an object to be processed from an electrostatic chuck as defined in claim 1, wherein the temperature of said object to be processed is detected by a temperature detection element that passes through said electrostatic chuck and faces a rear surface of said object.

* * * * *